(12) United States Patent
Huang et al.

(10) Patent No.: US 6,750,146 B2
(45) Date of Patent: Jun. 15, 2004

(54) METHOD FOR FORMING BARRIER LAYER

(75) Inventors: Chun-Chih Huang, Taipei (TW); Tai-Lang Chen, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 168 days.

(21) Appl. No.: 10/115,740

(22) Filed: Apr. 3, 2002

(65) Prior Publication Data

US 2003/0190813 A1 Oct. 9, 2003

(51) Int. Cl.[7] .............................................. H01L 21/301
(52) U.S. Cl. ...................... 438/694; 438/706; 438/710
(58) Field of Search .................................. 438/694, 702, 438/703, 706, 707, 710, 714, 720

(56) References Cited

U.S. PATENT DOCUMENTS

| | | | |
|---|---|---|---|
| 5,610,106 A | * | 3/1997 | Foster et al. ............... 438/680 |
| 6,271,136 B1 | * | 8/2001 | Shue et al. ................. 438/687 |
| 6,432,479 B2 | * | 8/2002 | Chang et al. ......... 427/255.394 |
| 6,555,183 B2 | * | 4/2003 | Wang et al. ................ 427/535 |

* cited by examiner

Primary Examiner—Kin-Chan Chen
(74) Attorney, Agent, or Firm—J.C. Patents (57) ABSTRACT

The present invention relates to a method for forming a titanium/titanium nitride barrier layer applied in a contact/via opening with a high aspect ratio. After forming a titanium layer by ion metal plasma and before depositing a titanium nitride layer by using metal organic chemical vapor deposition, a gas-stable step is performed for adjusting pressure by supplying a hydrogen gas, a helium gas, a reactive source and a carrier gas. By using hydrogen gas in the gas-stable step before depositing the titanium nitride layer, the RC delay and reflection index of the resultant barrier layer are substantially reduced, thus increasing the performance of the contact/via plug and the device.

22 Claims, 8 Drawing Sheets

Table 1

| step | 1 | 2 | 3 | 4 | 5 | 6 | 7 | 8 | 9 | 10 |
|---|---|---|---|---|---|---|---|---|---|---|
| name | pump | pre-chuck | chuck | heatup | pre-Dep1 | pre-Dep2 | Dep1 | pre-plsm1 | plsm1 | cool |
| time(s) | 5 | 3 | 4 | 15 | 2 | 5 | 11-13 | 3 | 35 | 5 |
| temp(°C) | 400 | 400 | 400 | 400 | 400 | 400 | 400 | 400 | 400 | 400 |
| RF power (w) | 0 | 0 | 0 | 0 | 0 | 0 | 0 | 0 | 0 | 0 |
| spacing (mils) | 315 | 315 | 315 | 315 | 315 | 315 | 315 | 315 | 315 | 315 |
| backside P (torr) | full P=0 | preset P=2.0 | preset P=2.0 | preset P=4.5 | preset P=3.5 | preset P=3.5 | preset P=3.5 | preset P=0.1 | preset P=0.0 | preset P=3.5 |
| N2 Dil (sccm) | 0 | 1000 | 1000 | 1000 | 1000 | 1000 | 1000 | 300 | 300 | 1000 |
| H2 (sccm) | 0 | 0 | 0 | 0 | 0 | 0 | 0 | 450 | 450 | 0 |
| TDMAT/He-car (sccm) | 0 | 0 | 0 | 0 | 375 btc | 375 btc | 375 | 0 | 0 | 0 |
| He-Dil (sccm) | 0 | 600 | 600 | 600 | 225 | 225 | 225 | 0 | 0 | 600 |

Table 2

| step | 1 | 2 | 3 | 4 | 5 | 6 | 7 | 8 | 9 | 10 |
|---|---|---|---|---|---|---|---|---|---|---|
| name | pump | pre-chuck | chuck | heatup | pre-Dep1 | pre-Dep2 | Dep1 | pre-plsm1 | plsm1 | cool |
| time(s) | 5 | 3 | 4 | 15 | 2 | 5 | 11–13 | 3 | 35 | 5 |
| temp(°C) | 400 | 400 | 400 | 400 | 400 | 400 | 400 | 400 | 400 | 400 |
| RF power (w) | 0 | 0 | 0 | 0 | 0 | 0 | 0 | 0 | 0 | 0 |
| spacing (mils) | 315 | 315 | 315 | 315 | 315 | 315 | 315 | 315 | 315 | 315 |
| backside P (torr) | full P=0 | preset P=2.0 | preset P=2.0 | preset P=4.5 | preset P=3.5 | preset P=3.5 | preset P=3.5 | preset P=0.1 | preset P=0.0 | preset P=3.5 |
| N2 Dil (sccm) | 0 | 1000 | 1000 | 1000 | 0 | 1000 | 1000 | 300 | 300 | 1000 |
| H2 (sccm) | 0 | 0 | 0 | 0 | 1000 | 0 | 0 | 450 | 450 | 0 |
| TDMAT/He-car (sccm) | 0 | 0 | 0 | 0 | 375 btc | 375 btc | 375 | 0 | 0 | 0 |
| He-Dil (sccm) | 0 | 600 | 600 | 600 | 225 | 225 | 225 | 0 | 0 | 600 |

METHOD FOR FORMING BARRIER LAYER

BACKGROUND OF THE INVENTION

1. Field of Invention

The present invention relates to a method of fabricating an integrated circuit (IC). More particularly, the present invention relates to a method of fabricating a barrier applied in contact/via plugs.

2. Description of Related Art

To match the ever increasing complexity and precision requirements of semiconductor integrated circuits, two or more metal interconnect layers formed above a substrate are common in semiconductor manufacturing. At present, a contact plug is used for connecting one terminal of a MOS component with a metallic layer, and a via plug is used for interconnecting two different metallic layers. One of the plugging techniques now employed by most VLSI circuit manufacturers is the tungsten plug.

Sandwiching another material between two layers in contact (such as tungsten and silicon) can prevent the intermixing of materials from these two layers. The role of this third material is to prevent the diffusion of the two materials into each other, or to resist the tendency of a chemical reaction to form a new phase between the adjoining materials.

Titanium nitride (TiN) is an attractive material as a contact/via barrier in silicon ICs because it behaves as an impermeable barrier to silicon, and because the activation energy for the diffusion of other impurities is high. Titanium nitride is also chemical and thermodynamically very stable.

Usually, titanium nitride films do not make direct contact to silicon; instead, a contact/via structure consisting of metal/TiN/Ti/Si is widely adopted. Such contact/via structure exhibits low resistivity and remarkably high thermal stability, with the ability to withstand temperatures up to 550° C. without failures.

In a conventional process for fabricating a barrier with a TiN/Ti/Si structure, a thin titanium layer is formed by sputtering and a titanium nitride layer is deposited over the titanium layer by reactive sputtering deposition. However, if the titanium nitride barrier formed by the conventional method is applied in a high aspect ratio contact, the thickness of the titanium nitride layer in the bottom of the contact window is usually insufficient.

SUMMARY OF THE INVENTION

Accordingly, the present invention is directed to providing a method of forming a barrier layer in contact/via plugs, which can reduce RC delays of the plugs, thereby enhancing the performances and the reliability of the plugs.

To achieve these and other advantages and in accordance with the purpose of the invention, as embodied and broadly described herein, the invention includes a method of forming a barrier layer in contact/via plugs. Particularly, the method of the present invention is suitable for forming a titanium/titanium nitride barrier layer within an opening with an aspect ratio higher than 5, preferably higher than 7.

As embodied and broadly described herein, the invention provides a method for forming a titanium/titanium nitride barrier layer, comprising: providing a substrate having an interlayer with an opening; forming a titanium layer conformal to a profile of the opening and over the substrate by an ion metal plasma process; performing a first gas-stable step for adjusting pressure by supplying a hydrogen gas, a helium gas, a reactive source and a carrier gas; depositing a first titanium nitride layer on the titanium layer by using metal organic chemical vapor deposition (MOCVD) with the reactive source and the carrier gas after performing the first gas-stable step; performing a first plasma treatment process to remove a portion of the first titanium nitride layer; performing a second gas-stable step for adjusting pressure by supplying the hydrogen gas, the helium gas, the reactive source and the carrier gas; depositing a second titanium nitride layer on the remained first titanium nitride layer by using MOCVD with the reactive source and the carrier gas after performing the second gas-stable step; and performing a second plasma treatment process to remove a portion of the second titanium nitride layer.

The opening within the interlayer can be a contact opening or a via opening. The reactive source and the carrier gas used in MOCVD are tetrakis(dimethyl)amino titanium and helium, respectively. Both the first and the second plasma treatment processes use a nitrogen/hydrogen plasma to treat the first and the second titanium nitride layers.

The average value of RC delays by using hydrogen gas in the gas-stable step is lower than that of using nitrogen gas in the gas-stable step by about 13%, while the average value of reflection indexes by using hydrogen gas in the gas-stable step is lower than that of using nitrogen gas in the gas-stable step by about 14%. By using hydrogen gas in the gas-stable step before depositing the titanium nitride layer, the RC delay and reflection index of the resultant barrier layer are substantially reduced, thus increasing the performance of the contact/via plug.

It is to be understood that both the foregoing general description and the following detailed description are exemplary, and are intended to provide further explanation of the invention as claimed.

BRIEF DESCRIPTION OF THE DRAWINGS

The file of this patent contains at least one drawing executed in color. The Patent and Trademark Office upon request and payment of the necessary fee will provide copies of this patent with color drawing(s).

The accompanying drawings are included to provide a further understanding of the invention, and are incorporated in and constitute a part of this specification. The drawings illustrate embodiments of the invention and, together with the description, serve to explain the principles of the invention. In the drawings, Table 1 shows an exemplary operating recipe of the processing machine.

Table 2 shows another exemplary operating recipe of the processing machine.

DESCRIPTION OF THE PREFERRED EMBODIMENTS

Figure 1:
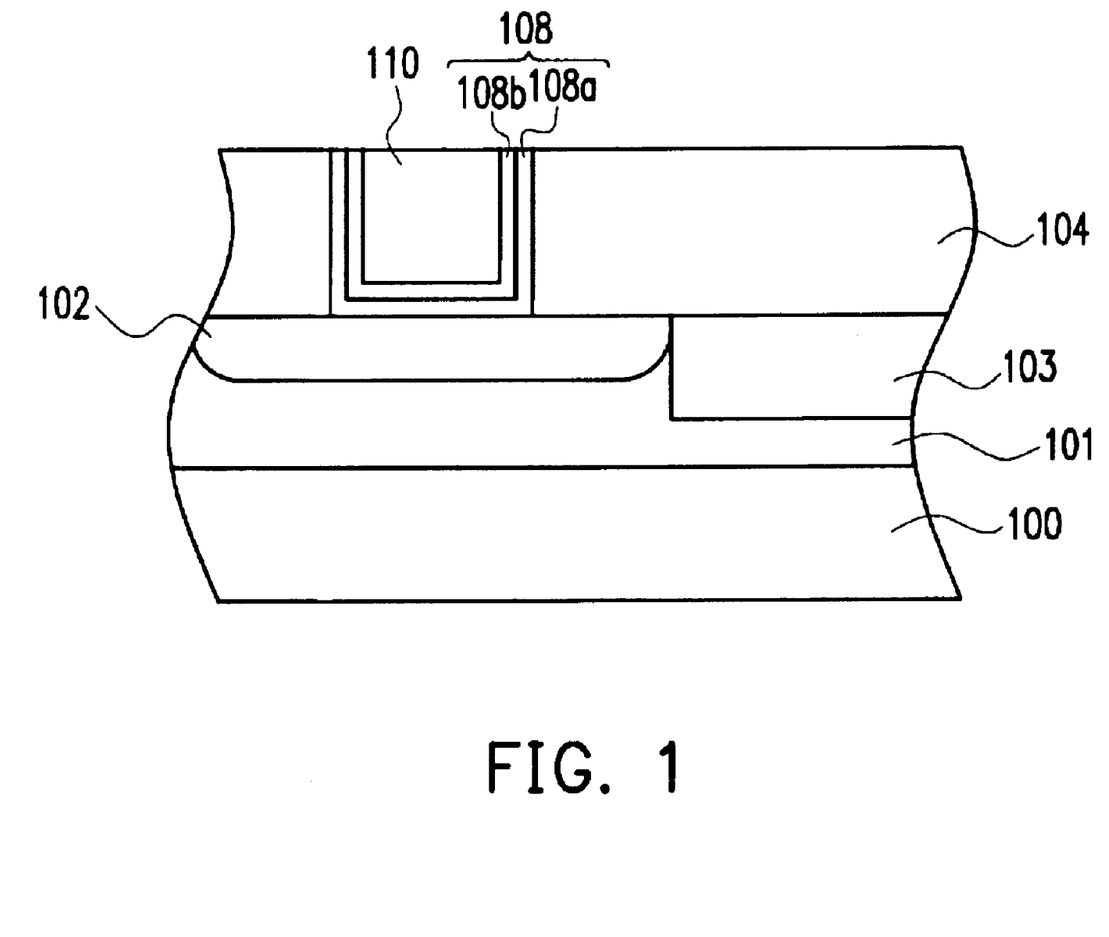
FIG. 1 is a cross-sectional view of a portion of a semiconductor substrate including a barrier layer according to one preferred embodiment of the present invention.

FIG. 1 is a cross-sectional view of a portion of a semiconductor substrate including a barrier layer according to one preferred embodiment of the present invention. First, as shown in FIG. 1, a semiconductor substrate 100 having a component layer 101 formed thereon is provided. The component layer 101 comprises at least one conductive region 102 and at least one isolation structure 103. The component layer 101 can further comprises one or more transistor components (not shown) and/or one or multiple metallic layers (not shown). The isolation structure 103 is, for example, a field oxide layer or a shallow trench isolation structure. A dielectric interlayer 104 formed on the substrate 100 covers the isolation structure 103 and the underlying conductive region 102. The conductive region 102 can be a polysilicon gate layer or a source/drain region of one of the transistors, or a metallic layer. For silicon-based semiconductor devices, dielectric materials for the dielectric interlayer 104 can be silicon dioxide, possibly doped with phosphorus, boron/phosphorus or arsenic, formed by conventional processes to the typical thickness employed in this technology.

The dielectric interlayer 104 is then patterned and etched down to form an opening 106 that exposes the conductive region 102. If the conductive region 102 is a polysilicon gate layer or a source/drain region of one of the transistors in the component layer 101, the opening 106 is a contact opening. If the conductive region 102 is a metallic layer in the component layer 101, the opening 106 is a via opening.

In accordance with the invention, a barrier layer 108 is formed in the opening 106 to ensure good adhesion and good electrical contact of subsequent layers to the underlying conductive region 102. The barrier layer 108 is a composite layer consisting of a titanium layer 108a and a titanium nitride layer 108b. The stoichiometric ratio of the titanium nitride layer 108b is not limited to 1:1, but dependent on the requiring electrical and physical properties. The barrier layer 108 is also a diffusion barrier layer. Finally, a conductive material layer 110 is formed on the barrier layer 108 and fills the opening 106. Preferred examples of such conductive materials include CVD or bias sputtered tungsten or molybdenum. An extra portion of the conductive material layer 110 is then removed by either planarization or dry etching. Thereafter, an anti-refractive coating layer (not shown) is formed on the remained conductive material layer 110, if necessary. The following processes for completing the plug manufacture are known to people in the art, and thus will not be described in details.

As discussed above, the titanium nitride barrier formed by the conventional method is not suitable for high aspect ratio contact/via. Therefore, for contact/via openings with relatively high aspect ratios, preferably aspect ratios higher than 7, the titanium/titanium nitride barrier layer 108 is preferably formed by the following methods. For the formation of the titanium layer 108a, an ion metal plasma (IMP) process is performed by preference. In the IMP process a plasma is utilized to ionize the sputtered titanium atoms. A back bias is applied to the bottom of the substrate 100 for accelerating the titanium ions formed by plasma, so that maximum bottom coverage and excellent step coverage are achieved and the thickness of the titanium layer can be well controlled. The titanium layer 108a has a thickness in the order of about 100 to 800 angstroms, preferably 250–350 angstroms. The titanium nitride layer 108b is preferably formed by metal organic chemical vapor deposition (MOCVD), using tetrakis(dimethyl)amino titanium (TDMAT) as a reactive source and helium gas as a carrier gas and under a reaction temperature of about 350–450° C. The resultant titanium nitride layer is very conformal to the profile of the titanium layer 108a. However, the resultant titanium nitride layer has a high content of carbon and oxygen and high resistivity.

Usually, the formation of the titanium layer 108a and the formation of the titanium nitride layer 108b are performed in the same processing machine. After the titanium layer is formed by the IMP process, the whole wafer is then transferred into the MOCVD chamber for depositing the following titanium nitride layer. The deposition of the titanium nitride layer can be a single deposition process or several deposition processes in combination of plasma treatment. For example, in order to deposit a titanium nitride layer having a thickness of 150 angstroms, a titanium nitride layer of 150 angstroms is first deposited by MOCVD in the chamber and nitrogen/hydrogen plasma treatment is then performed to etch the titanium nitride layer down to a thickness of 75 angstroms. The aforementioned process is then repeated again, so that a titanium nitride layer having a thickness of 150 angstroms is obtained through two deposition processes and two plasma treatment processes. The resultant titanium nitride layer through repeated deposition processes and plasma treatment processes preferably has a thickness of about 100 to 500 angstroms, more preferably 150–200 angstroms. By applying the plasma treatment processes, the obtained titanium nitride layer has a reduced carbon content and lower resistivity, along with increased film density and a stoichiometric ration nearly 1:1.

Before depositing the titanium nitride layer, a gas-stable step is performed in the chamber for adjusting and balancing the pressures of the reactive gas and the carrier gas. According to previous operating conditions, the gas-stable step includes pumping into nitrogen, helium and reactive gas/carrier gas (such as: TDMAT/He) to stabilize the pressure of the chamber. Table 1 shows an exemplary operating recipe of the processing machine according to the previous operating conditions. The gas-stable step includes steps 5 and 6 in the table 1. As shown in table 1, nitrogen is pumped into the chamber without pumping hydrogen gas in steps 5 and 6, which refers to N2 Dil 1000 sccm and H20 sccm (marked with circles).

According to the present invention, the gas-stable step includes pumping into hydrogen, helium and reactive gas/carrier gas (such as: TDMAT/He) to stabilize the pressure of the chamber. Table 2 shows an exemplary operating recipe of the processing machine according to one preferred embodiment of the present invention. The gas-stable step includes steps 5 and 6 in the table 2. As shown in table 2, hydrogen gas is pumped into the chamber without pumping nitrogen gas in step 5, which refers to N2 Dil 0 sccm and H21000 sccm, while nitrogen is pumped into the chamber without pumping hydrogen gas in step 6, which refers to N2 Dil 1000 sccm and H20 sccm (marked with circles).

One of the major features of the present invention is to pump hydrogen gas, instead of nitrogen gas, into the reaction chamber in the gas-stable step before depositing the titanium nitride layer on the titanium layer.

Figure 2A:
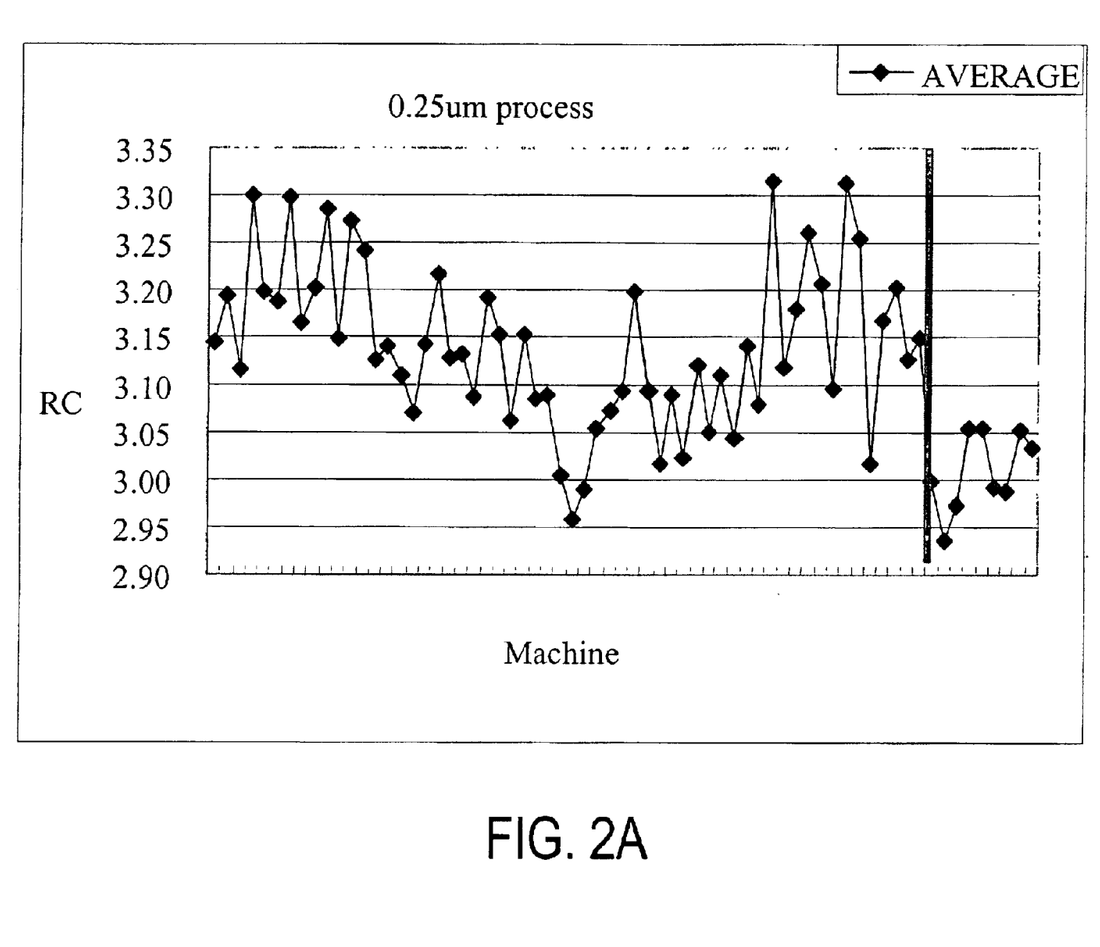
FIG. 2A is a chart showing measured RC delays for via plugs with a 0.25-micron manufacture process on the same processing machine.

Unexpected results are obtained by replacing nitrogen gas into hydrogen gas in the gas-stable step. FIG. 2A is a chart showing measured RC delays for via plugs with a 0.25-micron manufacture process on the same processing machine. The data points on the left side of the dividing line are obtained by using nitrogen gas in the gas-stable step, while the data points on the right side of the dividing line are obtained by using hydrogen gas in the gas-stable step. The average value of the measured RC delays by using hydrogen gas in the gas-stable step is lower than that of using nitrogen gas in the gas-stable step by about 4%.

Figure 2B:
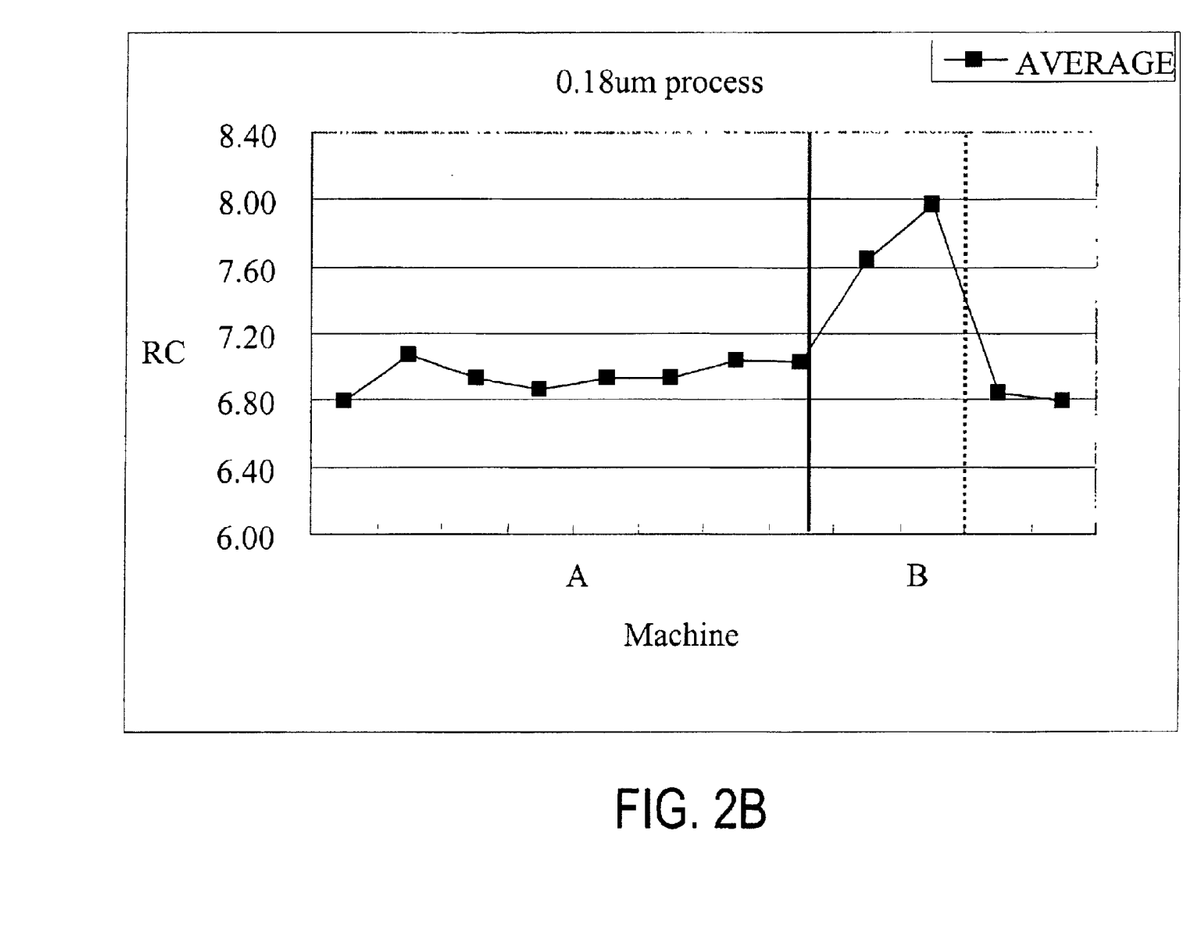
FIG. 2B is a chart showing measured RC delays for via plugs with a 0.18-micron manufacture process on two different processing machines I, II.

FIG. 2B is a chart showing measured RC delays for via plugs with a 0.18-micron manufacture process on two different processing machines I, II. The data points on the left side of the dividing line are obtained from machine I, while the data points on the right side of the dividing line are obtained from machine II. The data points between the dividing line and the dot line are obtained by using nitrogen gas in the gas-stable step, while the data points on the right side of the dot line are obtained by using hydrogen gas in the gas-stable step. The average value of the measured RC delays by using hydrogen gas in the gas-stable step is lower than that of using nitrogen gas in the gas-stable step by about 13%.

Figure 3:
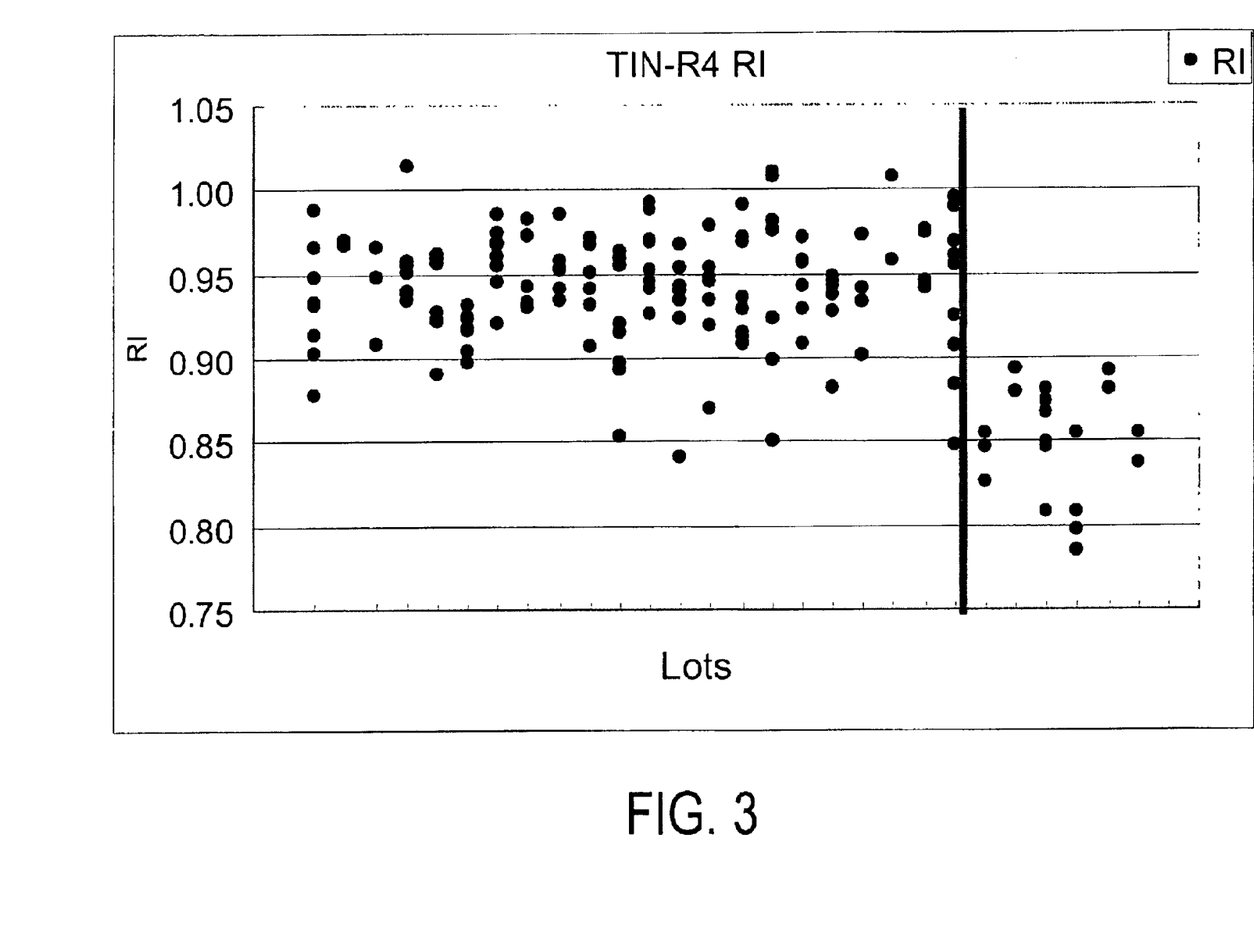
FIG. 3 is a chart showing measured reflection indexes for titanium layers in via plugs of different lots.

FIG. 3 is a chart showing measured reflection indexes for titanium layers in via plugs of different lots. The data points on the left side of the dividing line are obtained by using nitrogen gas in the gas-stable step, while the data points on the right side of the dividing line are obtained by using hydrogen gas in the gas-stable step. The average value of the measured reflection indexes by using hydrogen gas in the gas-stable step is lower than that of using nitrogen gas in the gas-stable step by about 14%.

Figure 4A:
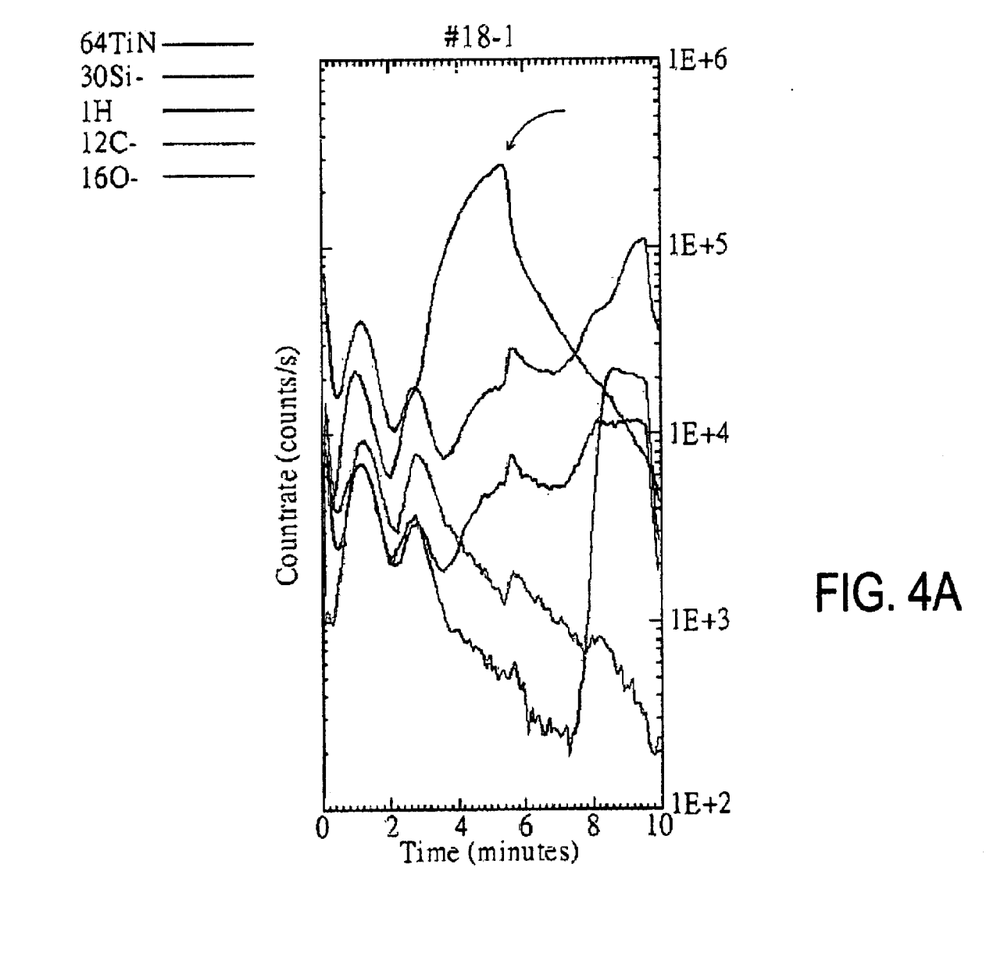
FIG. 4A is the SIMS spectrum taken from the titanium/titanium nitride interface using hydrogen in the gas-stable step according to one preferred embodiment of the present invention.
Figure 4B:
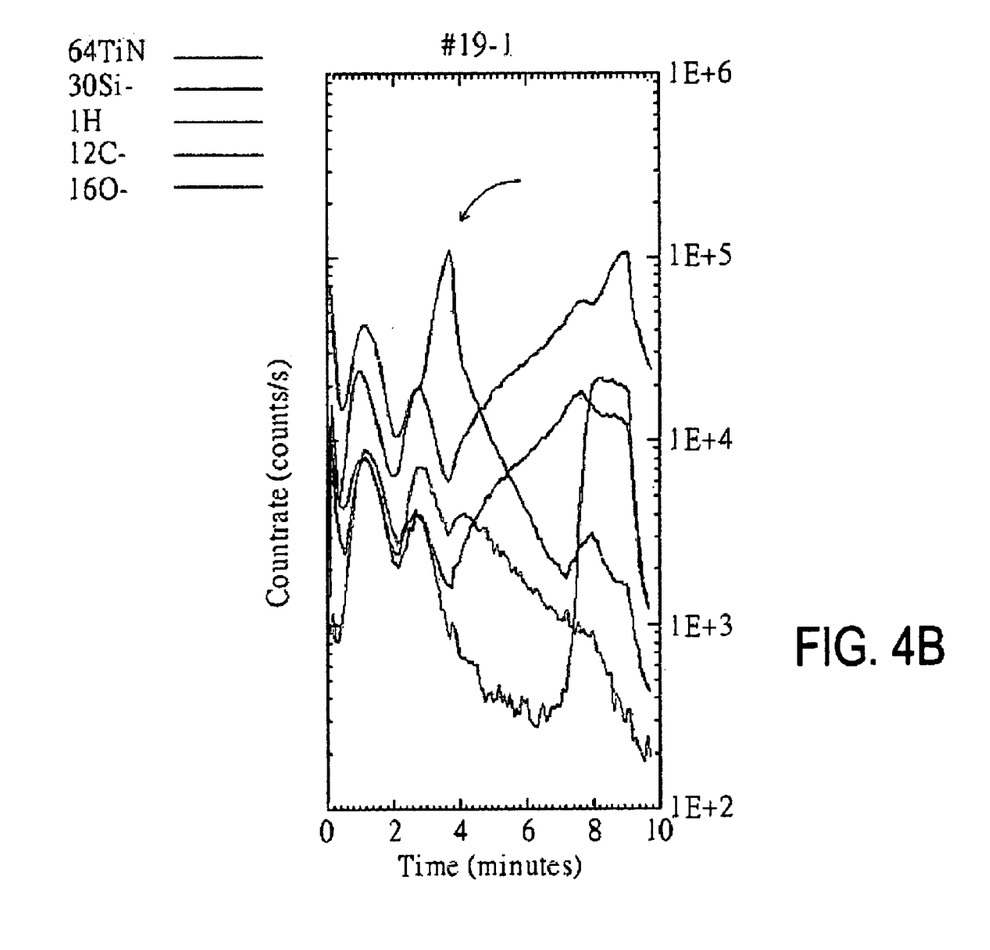
FIG. 4B is the SIMS spectrum taken from the titanium/titanium nitride interface using nitrogen in the gas-stable step.

Possibly mechanism is suggested from the measured SIMS spectrums that show the atom content in each interface of the plug structures. FIG. 4A is the SIMS spectrum taken from the titanium/titanium nitride interface using hydrogen in the gas-stable step, while FIG. 4B is the SIMS spectrum taken from the titanium/titanium nitride interface using nitrogen in the gas-stable step. From the comparison between the SIMS spectrums, it clearly shows that the obtained titanium/titanium nitride interface by using hydrogen in the gas-stable step has a higher hydrogen content (marked by the arrows). It is suggested that surface properties of the titanium/titanium nitride interface are changed due to the higher H content.

By using hydrogen gas in the gas-stable step before depositing the titanium nitride layer, the RC delay and reflection index of the resultant barrier layer are substantially reduced, thus increasing the performance of the contact/via plug.

Even though the barrier layer in accordance with the above-mentioned embodiment of the invention is applied in a contact plug or a via plug, it is clear for the people skilled in the art that the barrier layer formed according to the spirit of the present invention can be also applied on dual damascene structures or interconnect structures.

It is obvious that the method of forming a barrier layer according to the invention has the following advantages. The resultant barrier layer has reduced RC delay and lower reflection, especially suitable to be applied in contact/via openings with high aspect ratios. Moreover, the operating conditions and processes are compatible with the presently used processing machines and the conventional manufacture processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a barrier layer applied in a via opening, comprising:
    providing a substrate having a component layer formed thereon, wherein the component layer has at least a metallic layer formed within;
    forming a patterned interlayer on the component layer, wherein the patterned interlayer has at least an opening that exposes a portion of the metallic layer;
    forming a metal layer conformal to a profile of the opening;
    performing a first gas-stable step for adjusting pressure, wherein a hydrogen gas, a helium gas, a reactive source and a carrier gas are provided in the first gas-stable step;
    depositing a first titanium nitride layer on the metal layer by using the reactive source and the carrier gas, after performing the first gas-stable step;
    performing a first plasma treatment process to remove a portion of the first titanium nitride layer;
    performing a second gas-stable step for adjusting pressure, wherein the hydrogen gas, the helium gas, the reactive source and the carrier gas are provided in the second gas-stable step;
    depositing a second titanium nitride layer on the remained first titanium nitride layer by using the reactive source and the carrier gas, after performing the second gas-stable step; and
    performing a second plasma treatment process to remove a portion of the second titanium nitride layer.

2. The method of claim 1, wherein the step of forming the metal layer conformal to the profile of the opening includes an ion metal plasma process.

3. The method of claim 1, wherein the step of depositing the first titanium nitride layers includes a metal organic chemical vapor deposition (MOCVD) process.

4. The method of claim 3, the reactive source and the carrier gas used in the MOCVD process are tetrakis (dimethyl)amino titanium and helium, respectively.

5. The method of claim 1, wherein the step of depositing the second titanium nitride layers includes a metal organic chemical vapor deposition (MOCVD) process.

6. The method of claim 5, the reactive source and the carrier gas used in the MOCVD process are tetrakis (dimethyl)amino titanium and helium, respectively.

7. The method of claim 1, wherein the first plasma treatment process uses a nitrogen/hydrogen plasma to treat the first titanium nitride layer.

8. The method of claim 1, wherein the second plasma treatment process uses a nitrogen/hydrogen plasma to treat the second titanium nitride layer.

9. The method of claim 1, wherein a material for forming the metal layer includes titanium.

10. A method for forming a barrier layer applied in a contact opening, comprising:
    providing a substrate having a component layer formed thereon, wherein the component layer has at least a transistor formed within and the transistor includes a doped region;
    forming a patterned interlayer on the component layer, wherein the patterned interlayer has at least an opening that exposes a portion of the doped region;

forming a metal layer conformal to a profile of the opening;

performing a first gas-stable step for adjusting pressure, wherein a hydrogen gas, a helium gas, a reactive source and a carrier gas are provided in the first gas-stable step;

depositing a first titanium nitride layer on the metal layer by using the reactive source and the carrier gas, after performing the first gas-stable step;

performing a first plasma treatment process to remove a portion of the first titanium nitride layer;

performing a second gas-stable step for adjusting pressure, wherein the hydrogen gas, the helium gas, the reactive source and the carrier gas are provided in the second gas-stable step;

depositing a second titanium nitride layer on the remained first titanium nitride layer by using the reactive source and the carrier gas, after performing the second gas-stable step; and performing a second plasma treatment process to remove a portion of the second titanium nitride layer.

11. The method of claim 10, wherein the step of forming the metal layer conformal to the profile of the opening includes an ion metal plasma process.

12. The method of claim 10, wherein the step of depositing the first titanium nitride layers includes a metal organic chemical vapor deposition (MOCVD) process.

13. The method of claim 12, the reactive source and the carrier gas used in the MOCVD process are tetrakis (dimethyl)amino titanium and helium, respectively.

14. The method of claim 10, wherein the step of depositing the second titanium nitride layers includes a metal organic chemical vapor deposition (MOCVD) process.

15. The method of claim 14, the reactive source and the carrier gas used in the MOCVD process are tetrakis (dimethyl)amino titanium and helium, respectively.

16. The method of claim 10, wherein the first plasma treatment process uses a nitrogen/hydrogen plasma to treat the first titanium nitride layer.

17. The method of claim 10, wherein the second plasma treatment process uses a nitrogen/hydrogen plasma to treat the second titanium nitride layer.

18. The method of claim 10, wherein a material for forming the metal layer includes titanium.

19. A method for forming a titanium/titanium nitride barrier layer:

providing a substrate having an interlayer, wherein the interlayer has at least an opening;

forming a titanium layer conformal to a profile of the opening and over the substrate, by an ion metal plasma process;

performing a first gas-stable step for adjusting pressure by supplying a hydrogen gas, a helium gas, a reactive source and a carrier gas;

depositing a first titanium nitride layer on the titanium layer by using metal organic chemical vapor deposition (MOCVD) with the reactive source and the carrier gas, after performing the first gas-stable step;

performing a first plasma treatment process to remove a portion of the first titanium nitride layer;

performing a second gas-stable step for adjusting pressure by supplying the hydrogen gas, the helium gas, the reactive source and the carrier gas;

depositing a second titanium nitride layer on the remained first titanium nitride layer by using metal organic chemical vapor deposition with the reactive source and the carrier gas, after performing the second gas-stable step; and performing a second plasma treatment process to remove a portion of the second titanium nitride layer.

20. The method of claim 19, the reactive source and the carrier gas used in MOCVD are tetrakis(dimethyl)amino titanium and helium, respectively.

21. The method of claim 19, wherein the first plasma treatment process uses a nitrogen/hydrogen plasma to treat the first titanium nitride layer.

22. The method of claim 19, wherein the second plasma treatment process uses a nitrogen/hydrogen plasma to treat the second titanium nitride layer.

* * * * *